(12) United States Patent
Hioka et al.

(10) Patent No.: US 11,536,783 B2
(45) Date of Patent: Dec. 27, 2022

(54) SEMICONDUCTOR DEVICE

(71) Applicant: ABLIC Inc., Chiba (JP)

(72) Inventors: Takaaki Hioka, Chiba (JP); Tomoki Hikichi, Chiba (JP)

(73) Assignee: ABLIC INC., Chiba (JP)

( * ) Notice: Subject to any disclaimer, the term of this patent is extended or adjusted under 35 U.S.C. 154(b) by 252 days.

(21) Appl. No.: 16/750,242

(22) Filed: Jan. 23, 2020

(65) Prior Publication Data

US 2020/0249284 A1 Aug. 6, 2020

(30) Foreign Application Priority Data

Jan. 31, 2019 (JP) .............................. JP2019-015419

(51) Int. Cl.
*G01R 33/07* (2006.01)
*H01L 43/04* (2006.01)
*H01L 43/06* (2006.01)

(52) U.S. Cl.
CPC ......... *G01R 33/077* (2013.01); *G01R 33/075* (2013.01); *H01L 43/04* (2013.01); *H01L 43/065* (2013.01)

(58) Field of Classification Search
CPC ...... G01R 33/077; H01L 43/04; H01L 43/065
See application file for complete search history.

(56) References Cited

U.S. PATENT DOCUMENTS

| 2005/0230770 A1 | 10/2005 | Oohira |
| 2008/0074106 A1 | 3/2008 | Oohira |
| 2013/0342194 A1* | 12/2013 | Motz .................... G01R 33/077 324/251 |
| 2015/0069563 A1* | 3/2015 | Vanderhaegen ... G01R 33/0052 257/427 |
| 2015/0346289 A1* | 12/2015 | Ausserlechner ... G01R 33/0005 324/251 |
| 2016/0013399 A1 | 1/2016 | Dimitrijevic et al. |
| 2016/0200245 A1 | 7/2016 | Rivas et al. |
| 2016/0252589 A1 | 9/2016 | Raman et al. |

FOREIGN PATENT DOCUMENTS

| EP | 3203253 A1 | 8/2017 |
| JP | 2005-259803 A | 9/2005 |
| JP | 2008-8883 A | 1/2008 |
| JP | 2016-21568 A | 2/2016 |
| WO | WO 03/036733 A2 | 5/2003 |

OTHER PUBLICATIONS

Extended European Search Report in Europe Application No. 20152681.1, dated Jun. 26, 2020, 9 pages.

* cited by examiner

*Primary Examiner* — Latanya N Crawford Eason
(74) *Attorney, Agent, or Firm* — Crowell & Moring LLP (57) ABSTRACT

A semiconductor device includes a vertical Hall element provided in a first region of a semiconductor substrate, and having the first to the third electrodes arranged side by side in order along a first straight line; a circuit provided in a second region of the semiconductor substrate different from the first region, and having a heat source; and a second straight line intersecting orthogonally a current path for a Hall element drive current which flows between the first electrode and the third electrode. The second line passes a center of the vertical Hall element, and a center point of a region which reaches the highest temperature in the circuit during an operation of the vertical Hall element lies on the second straight line.

18 Claims, 5 Drawing Sheets

SEMICONDUCTOR DEVICE

RELATED APPLICATIONS

This application claims priority to Japanese Patent Application No. 2019-015419 filed on Jan. 31, 2019, the entire content of which is incorporated herein by reference.

BACKGROUND OF THE INVENTION

1. Field of the Invention

The present invention relates to a semiconductor device, and more particularly, to a semiconductor device including a vertical Hall element and a heat source.

2. Description of the Related Art

A Hall element is capable of detecting position or angle without contact as a magnetic sensor, and accordingly has various uses. While magnetic sensors that use a horizontal Hall element configured to detect magnetic field component perpendicular to a semiconductor substrate surface are particularly well known, there have been proposed various magnetic sensors that use a vertical Hall element configured to detect magnetic field component parallel to the substrate surface. Further, there has been proposed a magnetic sensor configured to detect a magnetic field two-dimensionally or three-dimensionally with use of a combination of a horizontal Hall element and a vertical Hall element.

Since it is difficult for a vertical Hall element to have a structure with high geometrical-symmetry, the vertical Hall element is more likely to generate a so-called offset voltage than the horizontal Hall element even though no magnetic field is applied. In a vertical Hall element which is used as a magnetic sensor, removal of the offset voltage is necessary. The spinning current method has been known as one of the methods.

For removal of the offset voltage through use of the spinning current method in a vertical Hall element which has five electrodes linearly arranged at some intervals on a surface of a semiconductor substrate, a method is known in which direction of the flow of the drive current is switched among four directions while the magnetic field is applied in a direction parallel to the semiconductor substrate (see, for example, FIG. 1 of WO 03/036733).

With this method, the offset voltage is removed by adding or subtracting the following first to fourth output signals. The first output signal corresponds to a potential difference caused between a center electrode and each of two electrodes on opposite ends by a drive current flowing in a direction (referred to as "first direction") from one of two electrodes on both sides of the center electrode to the other, the second output signal corresponds to a potential difference caused between the center electrode and each of the two electrodes on opposite ends by the drive current flowing in a direction (referred to as "second direction") opposite to the first direction, the third output signal corresponds to a potential difference caused between the two electrodes on both sides of the center electrode by the drive current flowing in a direction (referred to as "third direction") from the center electrode to each of the two electrodes on opposite ends, and the fourth output signal corresponds to a potential difference caused between the two electrodes on both sides of the center electrode by the drive current flowing in a direction (referred to as "fourth direction") opposite to the third direction.

In the conventional vertical Hall element as described in WO 03/036733, the temperature inside the vertical Hall element is not uniform and a temperature distribution occurs in the vertical Hall element, then a thermoelectric current constantly flows from a high-temperature portion to a low-temperature portion in the vertical Hall element. Such a state is made, for example, by a circuit for driving the vertical Hall element which includes an element acting as a heat source is provided around the vertical Hall element.

In the removal of the offset voltage through use of the spinning current method in the above-mentioned state, the current flows differently in the first to fourth directions due to the influence of the thermoelectric current, with the result that the offset voltage cannot be removed with sufficiently high accuracy.

SUMMARY OF THE INVENTION

In view of the above, it is an object of the present invention to provide a semiconductor device including a circuit having a heat source, and including a vertical Hall element in which an offset voltage can be removed with high accuracy through use of a spinning current method.

According to at least one embodiment of the present invention, a semiconductor device includes a first vertical Hall element provided in a first region of a semiconductor substrate, and having a first electrode, a second electrode, and a third electrode that are arranged side by side in order along a first straight line; a first circuit provided in a second region of the semiconductor substrate different from the first region, and having a heat source; and a second straight line intersecting orthogonally a first current path for a Hall element drive current which flows between the first electrode and the third electrode, the second straight line passing a center of the first vertical Hall element, wherein a center point of a region that reaches the highest temperature in the first circuit during an operation of the first vertical Hall element lies on the second straight line.

According to at least one embodiment of the present invention, heat generated from the heat source is transferred symmetrically in plan view with respect to the second straight line passing the center of the vertical Hall element, into the vertical Hall element from a portion at which the second straight line crosses an end portion of the vertical Hall element on the heat source side. Even though the vertical Hall element has a temperature distribution due to the influence of the heat generated from the heat source, upon switching the direction of the current flowing through the current path in accordance with the spinning current method, manner of flowing of the currents becomes substantially the same in every direction, and thus the offset voltage can be removed with high accuracy.

DETAILED DESCRIPTION OF THE PREFERRED EMBODIMENTS

In the following, embodiments of the present invention are described in detail with reference to the drawings.

First Embodiment

Figure 1:
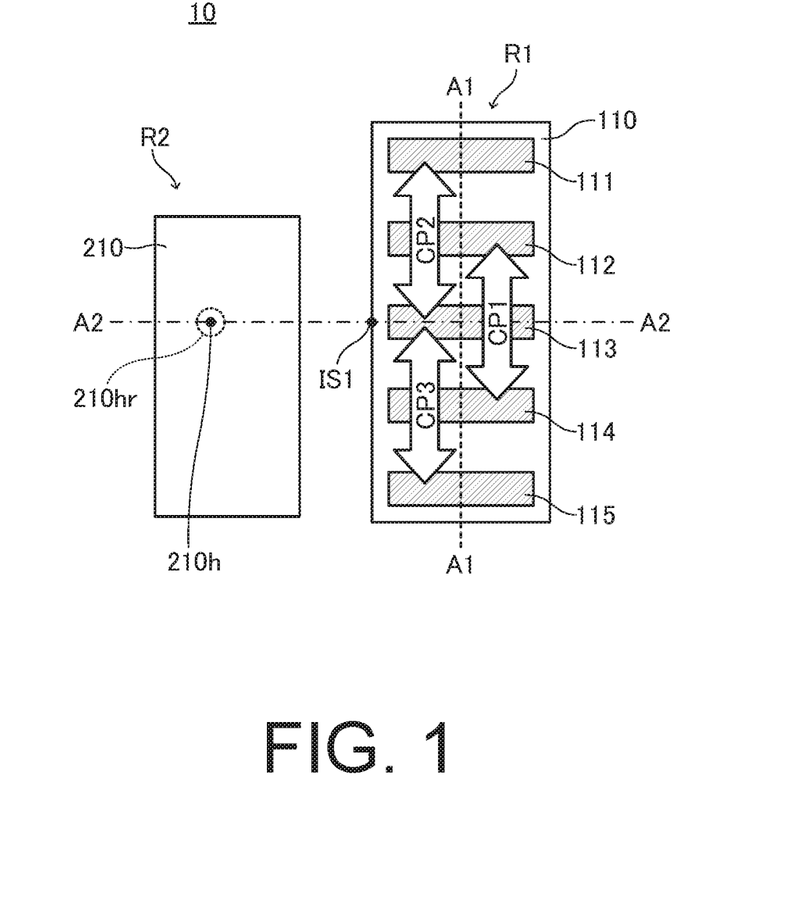
FIG. 1 is a plan view of a semiconductor device according to a first embodiment of the present invention.
Figure 2:
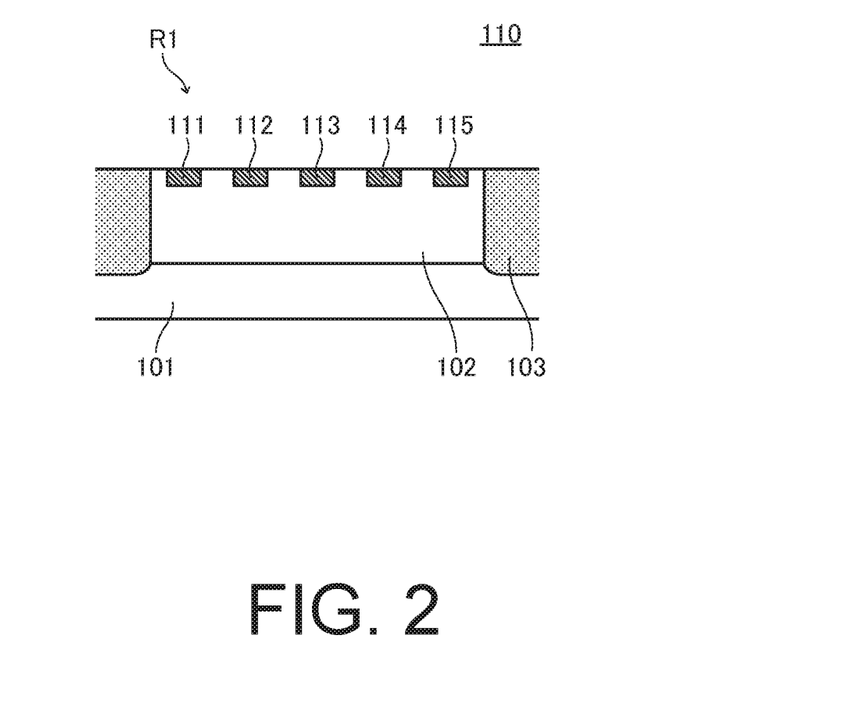
FIG. 2 is a sectional view taken along the line A1-A1 of FIG. 1.

FIG. 1 is a plan view of a semiconductor device 10 including a vertical Hall element and a heat source according to the first embodiment of the present invention. FIG. 2 is a sectional view taken along the line A1-A1 of FIG. 1. The line A1-A1 is supposed to equally divide the vertical Hall element 110 along the longitudinal direction.

As illustrated in FIG. 1, the semiconductor device 10 of the first embodiment includes a vertical Hall element 110 provided in a region R1 of a semiconductor substrate 101 (see FIG. 2), and a circuit 210 having a heat source which is provided in a region R2 different from the region R1.

As illustrated in FIG. 2, the vertical Hall element 110 includes an N-type (second conductivity type) semiconductor layer 102 formed as a magnetic sensing portion on the P-type (first conductivity type) semiconductor substrate 101, and electrodes 111 to 115 formed from N-type impurity regions and arranged in the surface of the semiconductor layer 102 as electrodes for supplying a drive current and for producing a Hall voltage. As illustrated in FIG. 1, the electrodes 111 to 115 are arranged side by side in order along the straight line A1-A1.

As illustrated in FIG. 2, a P-type element isolation diffusion layer 103 is formed around the vertical Hall element 110 so as to surround the vertical Hall element 110. The vertical Hall element 110 and the circuit 210 having the heat source are electrically isolated from each other by the element isolation diffusion layer 103.

The circuit 210 having the heat source is, for example, a circuit for driving the vertical Hall element 110 or a circuit for processing an output signal from the vertical Hall element 110. Such circuit has a transistor or the like acting as a heat source in many cases. Examples of the heat source include a resistive element through which large current flows and an output transistor of a voltage regulator which is used for obtaining an internal power supply voltage as a power supply voltage for driving the vertical Hall element 110, generated by stepping down an external power supply voltage through the voltage regulator, instead of using the external power supply voltage.

Next, a positional relationship between the vertical Hall element 110 and the circuit 210 having the heat source is described.

In the vertical Hall element 110 of FIG. 1, removal of an offset voltage through use of the spinning current method requires flow of the drive current in four directions, that is, a direction (first direction) from the electrode 112 to the electrode 114, a direction (second direction) from the electrode 114 to the electrode 112, a direction (third direction) from the electrode 113 to each of the electrode 111 and the electrode 115, and a direction (fourth direction) from each of the electrode 111 and the electrode 115 to the electrode 113, In FIG. 1, a current path CP1 for a Hall element drive current flowing between the electrode 112 and the electrode 114, a current path CP2 for a Hall element drive current flowing between the electrode 113 and the electrode 111, and a current path CP3 for a Hall element drive current flowing between the electrode 113 and the electrode 115 are illustrated. Specifically, the current path CP1 corresponds to a path for the drive current in the first direction and the second direction, and the current paths CP2 and CP3 correspond to paths for the drive current in the third direction and the fourth direction.

In the first embodiment, the vertical Hall element 110 and the circuit 210 having the heat source are arranged so that a center point 210h of a region 210hr that reaches the highest temperature in the circuit 210 during the operation of the vertical Hall element 110 (during execution of the spinning current method), lies on the straight line A2-A2 intersecting orthogonally the current path CP1 and passing the center of the vertical Hall element 110.

With this arrangement, heat generated from the heat source in the circuit 210 is transferred symmetrically in plan view with respect to the straight line A2-A2, into the vertical Hall element 110 from a portion IS1 at which the straight line A2-A2 crosses an end portion of the vertical Hall element 110 on the circuit 210 side. Even though the vertical Hall element 110 has a temperature distribution due to the influence of the heat generated from the heat source in the circuit 210, upon switching a direction in which a current flows through the current path CP1 between the first direction and the second directions in accordance with the spinning current method, manner of flowing of the two currents hence becomes substantially the same in those two directions.

Upon switching the direction of the current supplied to flow through each of the current paths CP2 and CP3 between the third direction and the fourth direction as well, the current path CP2 and the current path CP3 are arranged symmetrically in plan view with respect to the straight line A2-A2, and hence the vertical Hall element 110 has a temperature distribution symmetric in plan view with respect to the straight line A2-A2, with the result that the current path CP2 and the current path CP3 exhibit substantially the same and symmetric temperature distribution. Manner of flowing of the two current hence becomes substantially the same in the third direction and the fourth direction.

Consequently, according to the first embodiment, even though the heat generated from the heat source in the circuit 210 reaches the vertical Hall element 110 and the vertical Hall element 110 has a temperature distribution, the offset voltage can be removed with high accuracy through use of the spinning current method.

Here, the electrodes 111 to 115 of the vertical Hall element 110 preferably have substantially the same size and shape and are arranged at substantially equal intervals. With this configuration, the vertical Hall element 110 becomes line-symmetric with respect to its center line, that is, the straight line A2-A2, and manner of flowing of the currents becomes substantially the same in every direction in any of the current paths CP1, CP2, and CP3. This configuration allows highly accurate removal of the offset voltage through use of the spinning current method.

Second Embodiment

Figure 3:
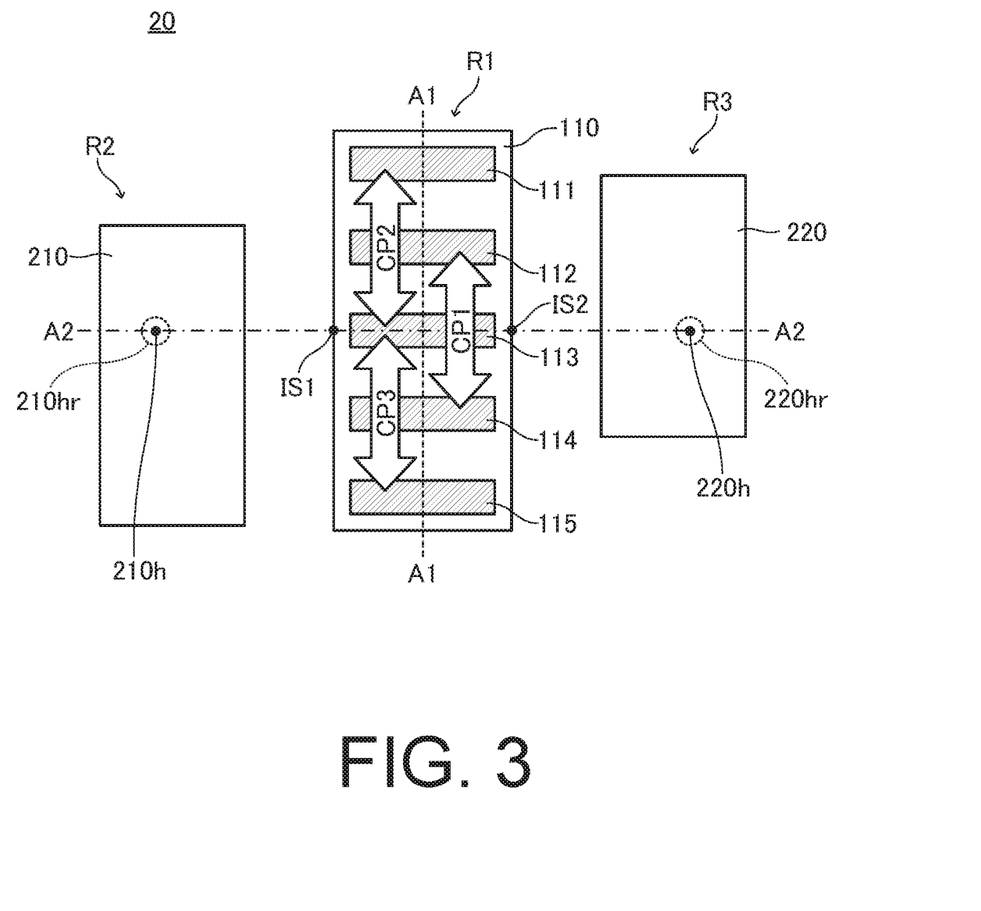
FIG. 3 is a plan view of a semiconductor device according to a second embodiment of the present invention.

In the first embodiment described above, the number of circuits having a heat source is one, but the number of circuits having a heat source in the circuits provided around the vertical Hall element is not limited to one. In the second embodiment of the present invention, description is given of a case in which a plurality of circuits having a heat source are provided around a vertical Hall element. FIG. 3 is a plan view of a semiconductor device 20 including a vertical Hall element and circuits having a heat source according to the second embodiment of the present invention.

As illustrated in FIG. 3, the semiconductor device 20 of the second embodiment further includes a circuit 220 having a heat source which is provided in a region R3 different from the regions R1 and R2 in addition to the components of the semiconductor device 10 of the first embodiment. The same components as those of the semiconductor device 10 of the first embodiment as illustrated in FIG. 1 are denoted by the same reference symbols, and redundant description thereof is omitted as appropriate.

In the semiconductor device 20 of the second embodiment, the circuit 220 having the heat source is provided so that a center point 220h of a region 220hr that reaches the highest temperature in the circuit 220 during the operation of the vertical Hall element 110 (during execution of the spinning current method), lies on the straight line A2-A2.

With this arrangement, heat generated from the heat source in the circuit 220 is transferred symmetrically in plan view with respect to the straight line A2-A2, into the vertical Hall element 110 from a portion IS2 at which the straight line A2-A2 crosses an end portion of the vertical Hall element 110 on the circuit 220 side. Accordingly, even though the vertical Hall element 110 has a temperature distribution due to an influence of the heat generated from the heat source in the circuit 220 similarly to the heat generated from the heat source in the circuit 210, upon switching the direction in which the current flows through the current path CP1 between the first direction and the second direction in accordance with the spinning current method, manner of flowing of the currents becomes substantially the same in those two directions. Further, the temperature distributions along the current path CP2 and the current path CP3 are also symmetric and substantially the same. Manner of flowing of the currents thus becomes substantially the same in the third direction and the fourth direction.

Consequently, according to the second embodiment, even though the heat generated from the heat source in the circuit 210 and the heat generated from the heat source in the circuit 220 reach the vertical Hall element 110, and generate a temperature distribution in the vertical Hall element 110, the offset voltage can be removed with high accuracy through use of the spinning current method.

As described above, even though a plurality of circuits having a heat source are provided, the offset voltage can be removed with high accuracy through use of the spinning current method.

In the first and second embodiments description was made for the one vertical Hall element. In the following, as third and fourth embodiments of the present invention, description is given of a plurality of vertical Hall elements provided on the same semiconductor substrate.

Third Embodiment

Figure 4:
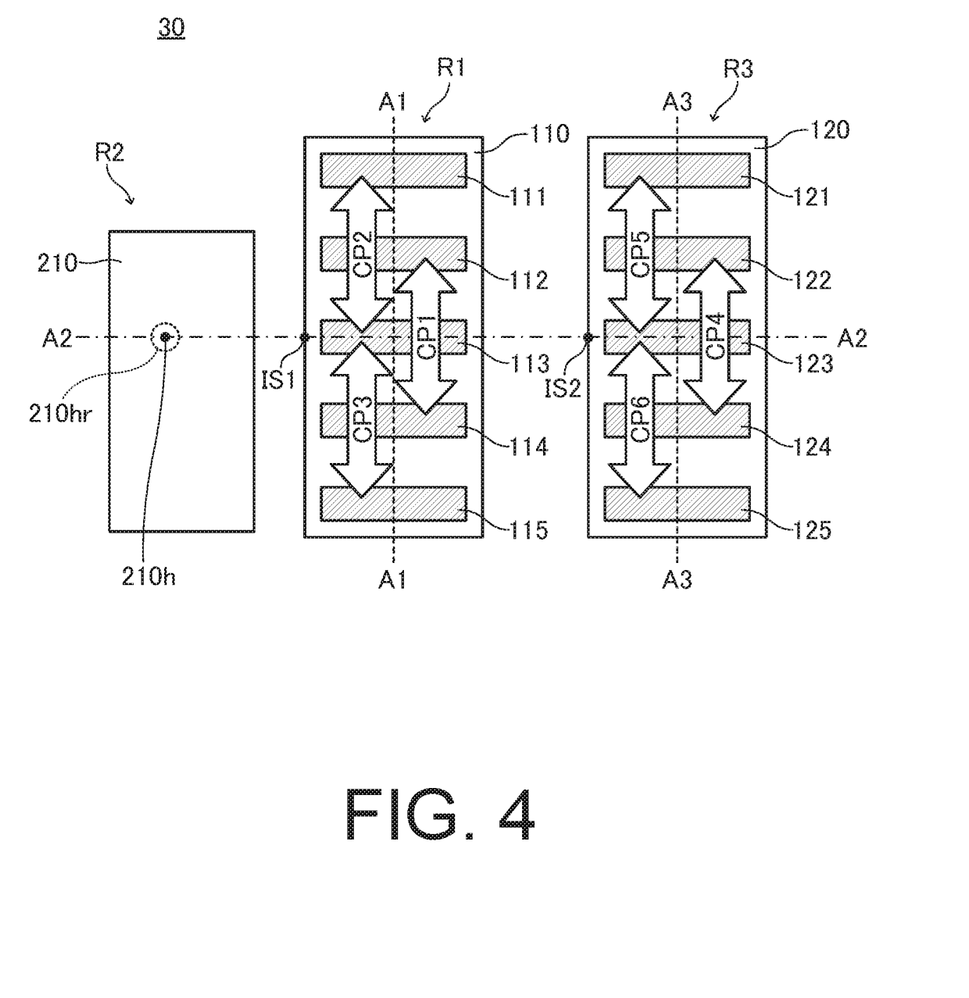
FIG. 4 is a plan view of a semiconductor device according to a third embodiment of the present invention.

In the third embodiment, description is given of two vertical Hall elements provided in parallel to each other on the same semiconductor substrate. FIG. 4 is a plan view of a semiconductor device 30 including vertical Hall elements and a heat source according to the third embodiment of the present invention.

As illustrated in FIG. 4, the semiconductor device 30 of the third embodiment further includes a vertical Hall element 120 provided in parallel to the vertical Hall element 110, in the region R3 different from the regions R1 and R2, in addition to the components of the semiconductor device 10 of the first embodiment. The same components as those of the semiconductor device 10 of the first embodiment as illustrated in FIG. 1 are denoted by the same reference symbols, and redundant description thereof is omitted as appropriate.

The vertical Hall element 120 includes the N-type semiconductor layer 102 (see FIG. 2) formed as the magnetic sensing portion on the P-type semiconductor substrate 101, and electrodes 121 to 125 formed from N-type impurity regions in the surface of the semiconductor layer 102 as electrodes for supplying a drive current and for outputting a Hall voltage. As illustrated in FIG. 4, the electrodes 121 to 125 are arranged side by side in order along the straight line A3-A3. The line A3-A3 is supposed to equally divide the vertical Hall element 120 along the longitudinal direction.

The P-type element isolation diffusion layer 103 (see FIG. 2) is formed to surround the vertical Hall element 120, and the circuit 210 having the heat source, the vertical Hall element 110, and the vertical Hall element 120 are electrically and mutually isolated by the element isolation diffusion layer 103.

Next, a positional relationship among the circuit 210 having the heat source, the vertical Hall element 110, and the vertical Hall element 120 is described.

In the vertical Hall element 120 of FIG. 4, removal of the offset voltage through use of the spinning current method requires flow of the drive current in four directions, that is, a direction (first direction) from the electrode 122 to the electrode 124, a direction (second direction) from the electrode 124 to the electrode 122, a direction (third direction) from the electrode 123 to each of the electrode 121 and the electrode 125, and a direction (fourth direction) from each of the electrode 121 and the electrode 125 to the electrode 123. In FIG. 4, a current path CP4 for a Hall element drive current flowing between the electrode 122 and the electrode 124, a current path CP5 for a Hall element drive current flowing between the electrode 123 and the electrode 121, and a current path CP6 for a Hall element drive current flowing between the electrode 123 and the electrode 125 are illustrated. Specifically, the current path CP4 corresponds to a path for a drive current in the first direction and the second direction in the vertical Hall element 120, and the current paths CP5 and CPC correspond to paths for a drive current in the third direction and the fourth direction in the vertical Hall element 120.

In the third embodiment, the vertical Hall element 120 is provided, in addition to the semiconductor device 10 of the first embodiment as illustrated in FIG. 1 in which the vertical Hall element 110 and the circuit 210, having the heat source are arranged so that the straight line intersecting orthogonally the current path CP4 in the vertical Hall element 120 and passing the center of the vertical Hall element 120 coincides with the straight line A2-A2. In the semiconductor device 10 of the first embodiment the center point 210h of the region 210hr that reaches the highest temperature in the circuit 210 during the operation of the vertical Hall element 110 (during execution of the spinning current method), lies on the straight line A2-A2 intersecting orthogonally the current path CP1 in the vertical Hall element 110 and passing the center of the vertical Hall element 110.

With this arrangement, during the operation of the vertical Hall element 120 (during execution of the spinning current method), heat generated from the heat source in the circuit 210 is transferred symmetrically in plan view with respect to the straight line A2-A2, into the vertical Hall element 120 from the portion IS2 at which the straight line A2-A2 crosses an end portion of the vertical Hall element 120 on the circuit 210 side. Even though the vertical Hall element 120 has a temperature distribution due to the influence of the heat generated from the heat source in the circuit 210, upon switching a direction in which a current flows through the current path CP4 between the first direction and the second direction in accordance with the spinning current method, manner of flowing of the two currents hence becomes substantially the same in those two directions. Further, the current path CP5 and the current path CP6 also exhibit substantially the same and symmetric temperature distribution. Manner of flowing of the two currents hence becomes substantially the same in the third direction and the fourth direction.

Consequently, according to the third embodiment, even though the heat generated from the heat source in the circuit 210 reaches the vertical Hall element 120 and the vertical Hall element 120 has a temperature distribution, the offset voltage can be removed with high accuracy through use of the spinning current method.

As described above, even though a plurality of vertical Hall elements is provided in parallel mutually on the same semiconductor substrate, the offset voltage can be removed with high accuracy through use of the spinning current method.

Fourth Embodiment

Figure 5:
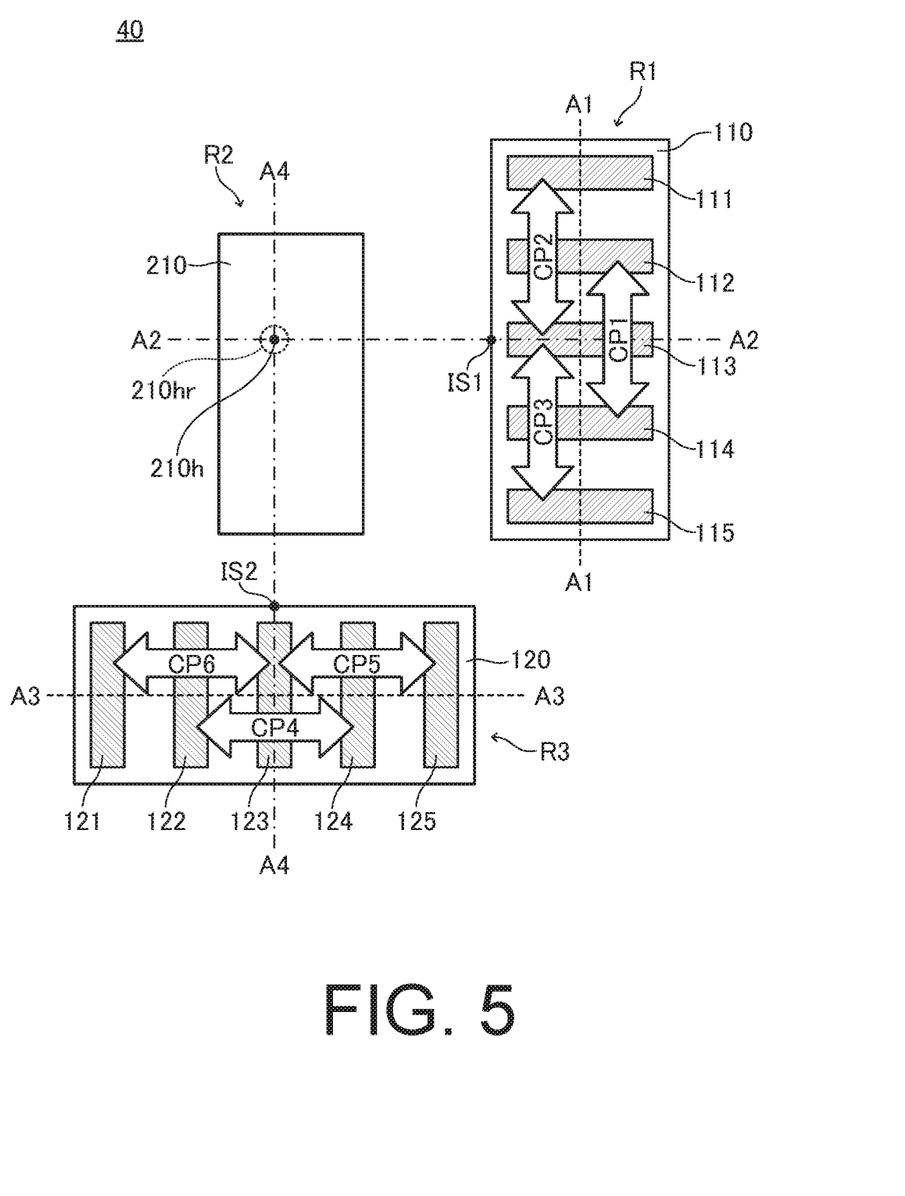
FIG. 5 is a plan view of a semiconductor device according to a fourth embodiment of the present invention.

In the fourth embodiment, description is given of a case in which two vertical Hall elements are arranged perpendicular to each other on the same semiconductor substrate. FIG. 5 is a plan view of a semiconductor device 40 including vertical Hall elements and a heat source according to the fourth embodiment of the present invention.

As illustrated in FIG. 5, the semiconductor device 40 of the fourth embodiment further includes the vertical Hall element 120 provided perpendicular to the vertical Hall element 110, in the region R3 different from the regions R1 and R2, in addition to the components of the semiconductor device 10 of the first embodiment. The same components as those of the semiconductor device 10 of the first embodiment as illustrated in FIG. 1 are denoted by the same reference symbols, and redundant description thereof is omitted as appropriate.

The vertical Hall element 120 includes the N-type semiconductor layer 102 (see FIG. 2) formed as the magnetic sensing portion on the P-type semiconductor substrate 101, and the electrodes 121 to 125 formed from N-type impurity regions in the surface of the semiconductor layer 102 as electrodes for supplying a drive current and for outputting a Hall voltage. As illustrated in FIG. 5, the electrodes 121 to 125 are arranged side by side in order along the straight line A3-A3 orthogonal to the straight line A1-A1. The line A3-A3 is supposed to equally divide the vertical Hall element 120 along the lateral direction.

The P-type element isolation diffusion layer 103 (see FIG. 2) is formed to surround the vertical Hall element 120, and the circuit 210 having the heat source, the vertical Hall element 110, and the vertical Hall element 120 are electrically and mutually isolated by the element isolation diffusion layer 103.

Next, a positional relationship among the circuit 210 having the heat source, the vertical Hall element 110, and the vertical Hall element 120 is described.

In the vertical Hall element 120 of FIG. 5, removal of the offset voltage through use of the spinning current method requires flow of the drive current in four directions, that is, a direction (first direction) from the electrode 122 to the electrode 124, a direction (second direction) from the electrode 124 to the electrode 122, a direction (third direction) from the electrode 123 to each of the electrode 121 and the electrode 125, and a direction (fourth direction) from each of the electrode 121 and the electrode 125 to the electrode 123.

In FIG. 5, the current path CP4 for a Hall element drive current flowing between the electrode 122 and the electrode 124, the current path CP5 for a Hall element drive current flowing between the electrode 123 and the electrode 121, and the current path CP6 for a Hall element drive current flowing between the electrode 123 and the electrode 125 are illustrated. Specifically, the current path CP4 corresponds to a path for a drive current in the first direction and the second direction in the vertical Hall element 120, and the current paths CP5 and CP6 correspond to paths for a drive current in the third direction and the fourth direction in the vertical Hall element 120.

In the fourth embodiment, the vertical Hall element 120 is provided, in addition to the semiconductor device 10 of the first embodiment as illustrated in FIG. 1 in which the vertical Hall element 110 and the circuit 210 having the heat source are arranged so that the center point 210*h* of the region 210*hr* lies on the straight line A4-A4 intersecting orthogonally the current path CP4 in the vertical Hall element 120 and passing the center of the vertical Hall element 120. In the semiconductor device 10 of the first embodiment the center point 210*h* of the region 210*hr* that reaches the highest temperature in the circuit 210 during the operation of the vertical Hall element HO (during execution of the spinning current method), lies on the straight line A2-A2 intersecting orthogonally the current path CP1 in the vertical Hall element 110 and passing the center of the vertical Hall element 110.

With this arrangement, during the operation of the vertical Hall element 120 (during execution of the spinning current method), heat generated from the heat source in the circuit 210 is transferred symmetrically in plan view with respect to the straight line A1-A4, into the vertical Hall element 120 from the portion 1S2 in the vertical Hall element 120 at which the straight line A1-A4 crosses an end portion of the vertical Hall element 120 on the circuit 210 side. Even though the vertical Hall element 120 has a temperature distribution due to the influence of the heat generated from the heat source in the circuit 210, upon switching a direction in which a current flows through the current path CP4 between the first direction and the second direction in accordance with the spinning current method, manner of flowing of the two currents hence becomes substantially the same in those two directions. Further, the current path CP5 and the current path CPC also exhibit substantially the same and symmetric temperature distribution. Manner of flowing of the two currents hence becomes substantially the same in the third direction and the fourth direction.

Consequently, according to the fourth embodiment, even though the heat generated from the heat source in the circuit 210 reaches the vertical Hall element 120, and the vertical Hall element 120 has a temperature distribution, the offset voltage can be removed with high accuracy through use of the spinning current method.

As described above, even though the two vertical Hall elements are arranged perpendicular to each other on the same semiconductor substrate, the offset voltage can be removed in each vertical Hall element with high accuracy through use of the spinning current method.

As described above, according to the embodiments of the present invention, even if any circuit having a heat source is provided around the vertical Hall element, it is possible to substantially eliminate an influence of heat generated from the heat source during execution of the spinning current method in the vertical Hall element. This eliminates the need to, for example, provide the circuit having the heat source away from the vertical Hall element, and thus enables reduction in circuit size.

The embodiments of the present invention have been described above, but the present invention is not limited to the above-mentioned embodiments, and it is to be understood that various modifications can be made thereto without departing from the gist of the present invention.

For example, in the example described in the above-mentioned embodiments, the vertical Hall element includes five electrodes. However, three or more electrodes in total, specifically, two electrodes for drive current supply and one electrode for Hall voltage output, suffice for the purpose.

Further, in the example described in the above-mentioned embodiments, the first conductivity type is the P type, and the second conductivity type is the N type. However, the opposite case is allowed, that is, the first conductivity type is the N type and the second conductivity type is the P type.

The electrodes 121 to 125 of the vertical Hall element 120 in the third and fourth embodiments preferably have substantially the same size and shape and are arranged at substantially equal intervals. With this configuration, the vertical Hall element 120 becomes line-symmetric with respect to its center line, that is, the straight line A3-A3, and manner of flowing of the currents becomes substantially the same in every direction in any of the current paths CP4, CP5, and CP6. This configuration allows highly accurate removal of the offset voltage through use of the spinning current method.

What is claimed is:

1. A semiconductor device, comprising:
a first vertical Hall element provided in a first region of a semiconductor substrate, and having a first electrode, a second electrode, and a third electrode which are arranged side by side in order along a first straight line;
a first circuit provided in a second region of the semiconductor substrate different from the first region, and having a heat source; and
a second straight line intersecting orthogonally a first current path for a Hall element drive current which flows between the first electrode and the third electrode, the second straight line passing a center of the first vertical Hall element,
wherein a center point of a region which reaches the highest temperature in the first circuit during an operation of the first vertical Hall element lies on the second straight line,
wherein the semiconductor device further comprises a second circuit provided in a third region of the semiconductor substrate different from the first region and the second region, and having a heat source,
wherein a center point of a region which reaches the highest temperature in the second circuit during the operation of the first vertical Hall element lies on the second straight line.

2. The semiconductor device according to claim 1, further comprising a second vertical Hall element provided in a third region of the semiconductor substrate different from the first region and the second region, and having a fourth electrode, a fifth electrode, and a sixth electrode which are arranged side by side in order along a third straight line,
wherein a straight line intersecting orthogonally a second current path for a Hall element drive current which flows between the fourth electrode and the sixth electrode, and passing a center of the second vertical Hall element, coincides with the second straight line.

3. The semiconductor device according to claim 1, further comprising:
a second vertical Hall element provided in a third region of the semiconductor substrate different from the first region and the second region, and having a fourth electrode, a fifth electrode, and a sixth electrode which are arranged side by side in order along a third straight line orthogonal to the first straight line; and
a fourth straight line intersecting orthogonally a second current path as a path for a Hall element drive current which flows between the fourth electrode and the sixth electrode, and passing a center of the second vertical Hall element, and
wherein the center point of the region that reaches the highest temperature in the first circuit during the operation of the first vertical Hall element lies on the fourth straight line.

4. The semiconductor device according to claim 1, wherein the first vertical Hall element further includes a seventh electrode and an eighth electrode provided side by side with respect to the first electrode, the second electrode, and the third electrode along the first straight line so as to sandwich the first electrode, the second electrode, and the third electrode.

5. The semiconductor device according to claim 1, wherein the first vertical Hall element is line-symmetric with respect to the second straight line.

6. The semiconductor device according to claim 2, wherein the second vertical Hall element further comprises a ninth electrode and a tenth electrode provided side by side with respect to the fourth electrode, the fifth electrode, and the sixth electrode along the third straight line so as to sandwich the fourth electrode, the fifth electrode, and the sixth electrode.

7. The semiconductor device according to claim 2, wherein the second vertical Hall element is line-symmetric with respect to the second straight line.

8. The semiconductor device according to claim 3, wherein the second vertical Hall element further comprises a ninth electrode and a tenth electrode provided side by side with respect to the fourth electrode, the fifth electrode, and the sixth electrode along the third straight line so as to sandwich the fourth electrode, the fifth electrode, and the sixth electrode.

9. The semiconductor device according to claim 3, wherein the second vertical Hall element is line-symmetric with respect to the fourth straight line.

10. A semiconductor device, comprising:
a first vertical Hall element provided in a first region of a semiconductor substrate, and having a first electrode, a second electrode, and a third electrode which are arranged side by side in order along a first straight line;
a first circuit provided in a second region of the semiconductor substrate different from the first region, and having a heat source; and
a second straight line intersecting orthogonally a first current path for a Hall element drive current which flows between the first electrode and the third electrode, the second straight line passing a center of the first vertical Hall element,
wherein a center point of a region which reaches the highest temperature in the first circuit during an operation of the first vertical Hall element lies on the second straight line,
wherein the semiconductor device further comprises:
a second vertical Hall element provided in a third region of the semiconductor substrate different from the first region and the second region, and having a fourth electrode, a fifth electrode, and a sixth electrode which are arranged side by side in order along a third straight line orthogonal to the first straight line; and a fourth straight line intersecting orthogonally a second current path as a path for a Hall element drive current which flows between the fourth electrode and the sixth electrode, and passing a center of the second vertical Hall element, and wherein the center point of the region that reaches the highest temperature in the first circuit during the operation of the first vertical Hall element lies on the fourth straight line.

11. The semiconductor device according to claim 10, wherein the first vertical Hall element further includes a seventh electrode and an eighth electrode provided side by side with respect to the first electrode, the second electrode, and the third electrode along the first straight line so as to sandwich the first electrode, the second electrode, and the third electrode.

12. The semiconductor device according to claim 10, wherein the first vertical Hall element is line-symmetric with respect to the second straight line.

13. The semiconductor device according to claim 10, wherein the second vertical Hall element further comprises a ninth electrode and a tenth electrode provided side by side with respect to the fourth electrode, the fifth electrode, and the sixth electrode along the third straight line so as to sandwich the fourth electrode, the fifth electrode, and the sixth electrode.

14. The semiconductor device according to claim 10, wherein the second vertical Hall element is line-symmetric with respect to the fourth straight line.

15. A semiconductor device, comprising:

a first vertical Hall element provided in a first region of a semiconductor substrate, and having a first electrode, a second electrode, and a third electrode which are arranged side by side in order along a first straight line;

a first circuit provided in a second region of the semiconductor substrate different from the first region, and having a heat source; and a second straight line intersecting orthogonally a first current path for a Hall element drive current which flows between the first electrode and the third electrode, the second straight line passing a center of the first vertical Hall element, wherein a center point of a region which reaches the highest temperature in the first circuit during an operation of the first vertical Hall element lies on the second straight line, wherein the device further comprises a second vertical Hall element provided in a third region of the semiconductor substrate different from the first region and the second region, and having a fourth electrode, a fifth electrode, and a sixth electrode which are arranged side by side in order along a third straight line, wherein a straight line intersecting orthogonally a second current path for a Hall element drive current which flows between the fourth electrode and the sixth electrode, and passing a center of the second vertical Hall element, coincides with the second straight line, and wherein the second vertical Hall element further comprises a ninth electrode and a tenth electrode provided side by side with respect to the fourth electrode, the fifth electrode, and the sixth electrode along the third straight line so as to sandwich the fourth electrode, the fifth electrode, and the sixth electrode.

16. The semiconductor device according to claim 15, wherein the first vertical Hall element further includes a seventh electrode and an eighth electrode provided side by side with respect to the first electrode, the second electrode, and the third electrode along the first straight line so as to sandwich the first electrode, the second electrode, and the third electrode.

17. The semiconductor device according to claim 15, wherein the first vertical Hall element is line-symmetric with respect to the second straight line.

18. The semiconductor device according to claim 15, wherein the second vertical Hall element is line-symmetric with respect to the second straight line.

* * * * *